United States Patent
Freitag et al.

(10) Patent No.: US 6,824,277 B2
(45) Date of Patent: Nov. 30, 2004

(54) OPTICAL BEAM GUIDANCE SYSTEM AND METHOD FOR PREVENTING CONTAMINATION OF OPTICAL COMPONENTS CONTAINED THEREIN

(75) Inventors: Ansgar Freitag, Heidenheim (DE); Ulrich Bingel, Lauterburg (DE); Josef Distl, Oberkochen (DE); Uwe W. Hamm, Langenau (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/079,580

(22) Filed: Feb. 22, 2002

(65) Prior Publication Data

US 2002/0145808 A1 Oct. 10, 2002

(30) Foreign Application Priority Data

Feb. 24, 2001 (DE) ......... 101 09 031

(51) Int. Cl.[7] ............ G02B 7/02; G02B 13/14; G03B 27/52
(52) U.S. Cl. ........ 359/507; 359/355; 359/811; 359/819; 359/900; 355/67
(58) Field of Search ............ 359/507, 513, 359/514, 350, 355, 811, 819, 900; 355/53, 67

(56) References Cited

U.S. PATENT DOCUMENTS

| | | | |
|---|---|---|---|
| 3,904,277 A | * 9/1975 | Phillips et al. | 235/472.03 |
| 3,969,151 A | * 7/1976 | Hill et al. | 148/276 |
| 4,111,762 A | * 9/1978 | Wade et al. | 205/208 |
| 5,137,767 A | 8/1992 | Miyauchi et al. | |
| 5,456,768 A | * 10/1995 | Tomari et al. | 148/280 |
| 5,508,528 A | 4/1996 | Mulkens et al. | |
| 5,602,683 A | 2/1997 | Straaijer et al. | |
| 5,685,895 A | 11/1997 | Hagiwara et al. | |
| 5,696,623 A | 12/1997 | Fujie et al. | |
| 5,906,688 A | * 5/1999 | Ohmi | 148/284 |
| 6,014,263 A | 1/2000 | Schaeffer et al. | |
| 6,451,130 B1 | * 9/2002 | Chung et al. | 148/286 |
| 6,496,248 B2 | * 12/2002 | Tanaka | 355/72 |
| 6,520,650 B2 | * 2/2003 | Fraizer | 359/514 |
| 6,555,234 B1 | * 4/2003 | Piao | 428/446 |
| 6,628,371 B1 | * 9/2003 | Ishikawa | 355/69 |
| 6,633,364 B2 | * 10/2003 | Hayashi | 355/53 |

FOREIGN PATENT DOCUMENTS

| | | | |
|---|---|---|---|
| DE | 3534366 A1 | | 4/1987 |
| DE | 19830438 A1 | | 1/2000 |
| JP | 02022612 A | | 1/1990 |
| JP | 11-14876 A | * | 1/1999 |
| JP | 11014876 A | | 1/1999 |
| JP | 2000315645 A | | 11/2000 |
| JP | 2000-315645 A | * | 11/2000 |

* cited by examiner

*Primary Examiner*—John Juba, Jr.
(74) *Attorney, Agent, or Firm*—Sughrue Mion, PLLC

(57) ABSTRACT

A method for reducing the contamination of at least one optical component (2, 3) contained in the beam guidance space (6) and held by a frame (4, 5) defining the beam guidance space and a corresponding optical beam guidance system. The surfaces of the frame bordering on the beam guidance space are at least partially coated with a degassing barrier layer (7) that preferably does not increase reflectivity. The method and system have use, for example, in lithography irradiation systems working with UV light.

13 Claims, 1 Drawing Sheet

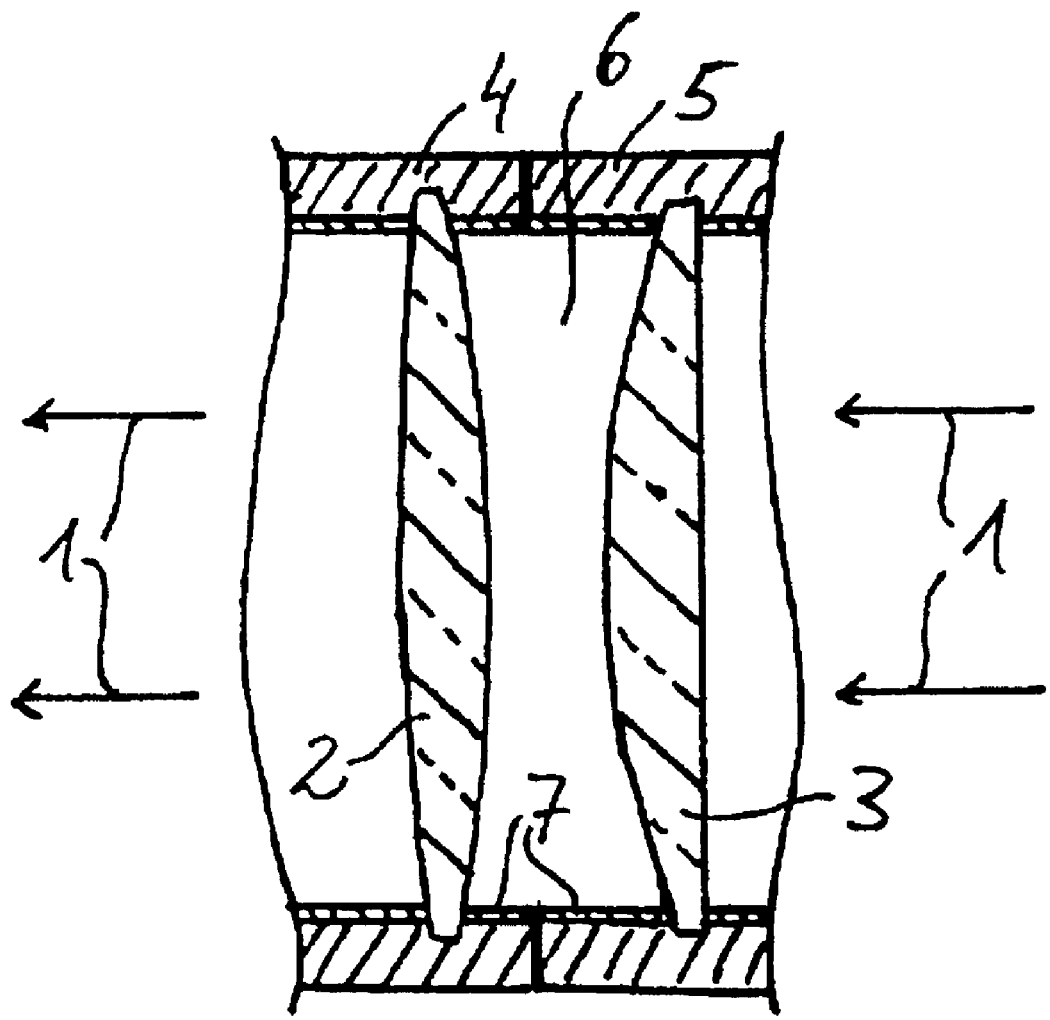
Fig.

OPTICAL BEAM GUIDANCE SYSTEM AND METHOD FOR PREVENTING CONTAMINATION OF OPTICAL COMPONENTS CONTAINED THEREIN

The following disclosure is based on German Patent Application No. 101 09 031.5 filed on Feb. 24, 2001, which is incorporated into this application by reference.

BACKGROUND OF THE INVENTION

1. Field of the Invention

This invention relates to a method for reducing the contamination of at least one optical component that is contained inside a beam guidance space and that is held by a frame defining the beam guidance space. The invention further relates to a corresponding beam guidance system for UV light with a frame defining a beam guidance space and holding at least one optical component contained in the beam guidance space.

2. Description of the Related Art

Such optical beam guidance systems are used for example in UV lasers and in lithography irradiation systems for structure-creating UV irradiation of semiconductor wafers. The frame defines the beam guidance space available for the UV light beam trajectory and holds one or more optical components contained therein. In other words, the term frame designates the casing-like and/or frame-like components that have surfaces bordering on the beam guidance space and that limit it and/or that contain one or more optical components.

It is known that in lithography irradiation systems working with UV light, contaminations occur on the surface of the optical components, which may considerably affect their intended optical function, such as the image quality of lenses that are used in projection lens systems of lithography irradiation systems between the position of a structuring mask and the position of a wafer to be irradiated or in the added mask illumination part of such devices.

Traditionally, the occurrence of such contamination effects is attributed to contaminations coming directly from the irradiated substrate or from the gas atmosphere used or to contaminations created at frame surfaces and/or surfaces of the optical components facing the beam guidance space from substances contained in the gas atmosphere after the beam guidance system is manufactured. It is known that such deposits may be removed during the operation using different decontamination procedures (cf. German patent application DE 198 30 438 AI). However, this requires extra effort and possibly interruptions of the irradiation operation.

In the patent specification U.S. Pat. No. 5,602,683, it is proposed to keep the beam guidance space inside the lens frame filled with a gas containing ozone in order to prevent contamination of a lens system with several lens elements arranged in a lens frame enclosing the beam guidance space.

In the patent specification U.S. Pat. No. 5,696,623, oxides of C, S, Sn, Mg, Si, and the like are held responsible for the contamination of the lens system of a UV irradiation system. It is assumed that these oxides are created from components of an atmosphere gas or of degassing components of the lens setup. In order to avoid contamination, it is proposed to introduce a non-oxidizing gas in the space around the lens surface, such as a noble gas, a reducing gas, or an atmosphere gas with most of the oxygen removed.

In the patent specification U.S. Pat. No. 5,685,895, experiments are mentioned from which it was concluded that the sources for contamination of optical elements in lithography irradiation systems are usually found in the environment of the system rather than in the system itself. This is especially the case for ammonia radicals, sulfuric acid and nitric acid radicals, as well as organic silanes. The use of black anodized aluminum as a mounting support or as a shield is blamed as the cause for often observed ammonium sulfate contaminations. The black anodized aluminum contains a diazo coloring agent and undergoes a treatment with sulfuric acid. These substances may be sources of ammonia radicals and sulfuric acid radicals, which compound to ammonium sulfate in a photochemical reaction.

The patent specification U.S. Pat. No. 6,014,263 deals with the prevention of contamination of an optical lens in an oxidizing environment, in particular at high temperatures, such as a lens in a pyrometer for measuring the exhaust temperature of a gas turbine. In the specification, the lens deposits are attributed to the creation of a volatile oxide on the surface of the corresponding lens frame. It has been found that in the high operation temperatures of 650° C. and more in the turbine, volatile oxides of chromium and/or molybdenum may be created from frames containing chromium and/or molybdenum, such as stainless steel. These volatile oxides can then reach the lens surface and cause the deposit. As a remedy, it is suggested to apply a protective layer to the surface area of the frame or the mounting support of the lens that is affected by the oxidation. This layer shall prevent the chromium or molybdenum contained in the material of the lens mounting support from coming into contact with the oxidizing atmosphere on the surface. The coating is designed such that under the high operation temperatures, it creates a protective layer of nonvolatile aluminum oxide.

One object of the invention is to provide a method of the previously mentioned type with which the contamination effects in optical components of a beam guidance system working with UV light may be avoided, or at least reduced, in a new and advantageous manner without affecting the operation and/or the beam guidance quality of the beam guidance system. A further object of the invention is to provide a corresponding beam guidance system.

SUMMARY OF THE INVENTION

According to one formulation, the invention provides a method for reducing the contamination of at least one optical component that is contained inside a beam guidance space and that is held by a frame defining the beam guidance space, wherein the surfaces of the frame neighboring the beam guidance space are coated at least partially with a degassing barrier layer. As a measure for reducing contamination according to this invention, the surfaces of the frame bordering on the beam guidance space are at least partially coated with a degassing barrier layer. It appears that this measure alone, or in connection with other traditional measures, can considerably reduce the contamination of lenses and other optical components in optical beam guidance systems for UV light.

The inventors have determined that often a considerable contribution to the contamination of optical components in such system is made by degassing from the frame material, which is often a stainless steel material. The degassing barrier layer is chosen by definition so that it blocks such degassing from the frame material completely, or at least partially, i.e., it acts as a barrier for the degassed substances. At the same time, the degassing barrier layer is preferably chosen so that it does not increase reflectivity for the UV light used, i.e., the reflectivity of the surface sections of the frame with the coating is not higher for UV light of the wavelength range used than the reflectivity without the coating. This ensures that the beam guidance quality of the system is not affected by increased reflections of the employed UV light on the degassing barrier layer. The surface coating with the degassing barrier layer can be provided particularly for frames of lenses and other optical components of the system, but may also be used for other casing parts limiting the beam guidance space if need be.

In a preferred embodiment of the invention, the degassing barrier layer has been designed in its reflection behavior such that it does not increase reflectivity for at least the UV wavelengths 157 nm, 193 nm, 248 nm and 365 nm, which are often used in lithography irradiation systems.

Special degassing barrier layers that have good adhesion and a high degassing barrier effect for degassing components typically observed and that reduce reflection for the UV light are a chemically deposited nickel layer, or a silver, gold or tantalum layer. A NiP alloy layer with a minor part of phosphorus may be used, which is chemically deposited in an electrolyte by using sodium hypophosphite as a reducing agent.

Advantageous embodiments of the invention will now be explained in more detail with reference to the drawing.

BRIEF DESCRIPTION OF THE DRAWINGS

The only FIGURE shows a schematic section of a longitudinal section through a part of an optical beam guidance system for UV light.

DETAILED DESCRIPTION OF PREFERRED EMBODIMENTS

In the FIGURE, part of an optical beam guidance system is shown in the view of a sectional longitudinal section. The system is designed for the optical beam guidance of a beam of UV light 1. This UV beam guidance system may be in particular a projection lens system of a lithography irradiation system that is located between a mask mounting support and a wafer mounting support. It may also be an illumination device located between a UV laser light source and the mask mounting support or a laser source system component added to the illumination device.

The optical beam guidance system contains several optical components located in the traditional manner in the ray trajectory of the UV light 1, of which two lenses 2, 3 are shown as an example here. The optical components 2 and 3 are each supported by a ring shaped frame 4 and 5. The frames 4 and 5 are typically made of a stainless steel material and are connected to each other at the front. They act as a frame in the corresponding section of the beam guidance system, limiting a beam guidance space 6 inside in which the two lenses 2 and 3 are located at the desired positions of the UV light ray trajectory 1.

Experiments have shown that trace components may degas from the frames, causing contamination of the optical surfaces. By applying a suitable coating to the frames and/or other mounting support parts for lenses and optical components, the degassing of trace components from the frames or the other mounting support parts may be avoided. For this purpose, the surfaces of the frames 4 and 5 that face the beam guidance space 6 must be coated with a degassing barrier layer 7.

The type and composition of the degassing barrier layer 7 is adjusted to the substances that degas primarily from the material used in the frames 4 and 5 so that the degassing may be prevented completely or at least reduced considerably. It is shown that chemically deposited layers of nickel, silver, gold, and tantalum are particularly suitable for blocking the degassing mainly occurring in steel frames. These layers also fulfill the other requirement for the degassing barrier layer 7 in that they do not increase stray light reflections for the UV light used. In particular, the mentioned degassing barrier layers exhibit some significant reflection reducing properties in the UV wavelength range important for lithography irradiation systems, i.e. between 157 nm and 365 nm and especially for the wavelengths 157 nm, 193 nm, 248 nm, and 365 nm. Layers of TiN or CrN, on the other hand, cause increased reflection for these wavelengths.

The inventors recognized a coating of the stainless steel frames 4 and 5 with a chemically deposited nickel layer to be particularly suitable for reducing degassing. The coating is applied as a NiP alloy layer, which is chemically deposited in an electrolyte containing nickel in the form of nickel sulfate and sodium hypophosphite as a reducing agent. The phosphorus atoms also created in this electrochemical reaction are included in the layer, with the resulting NiP alloy layer containing a typical mass percentage of phosphorus in the range of 3% to 15%. The chemically deposited Ni layer, or NiP layer to be more precise, typically reduces the interfering degassing by up to two orders of magnitude.

All mentioned degassing barrier layers can be applied current-free either chemically or with other depositing procedures, such as PVD procedures, to traditional frame materials, such as stainless steel. The resulting layer is sufficiently adhesive and highly uniform.

The description above of an advantageous embodiment shows that according to the invention, contaminations of lenses and other optical components of a beam guidance system for UV light, which are caused by degassing from the material of a frame defining the beam guidance space, can be effectively reduced. This is achieved by coating the surfaces of the frames of the optical components or other casing parts defining the beam guidance space completely, or at least partially, with a degassing barrier layer that does not increase reflection. It is understood that this measure is suitable for any optical beam guidance systems working with UV light, and in particular, as previously mentioned, for projection lenses, illumination devices, and laser light sources of lithography irradiation systems using UV light. It is also shown that the degassing barrier layer chosen with regards to its degassing barrier effectiveness and its reflection reduction is suitable not only for blocking degassing from steel materials but also from aluminum alloys, as they are often used for framing components defining the beam guidance space, for example in UV lasers.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

What is claimed is:

1. A method for reducing the contamination of at least one optical component, that is contained inside a beam guidance space and that is held by a frame defining the beam guidance space, comprising:

coating stainless steel surfaces of the frame neighboring the beam guidance space at least partially with a degassing barrier layer.

2. A method according to claim 1, wherein the degassing barrier layer is chosen such that it does not increase reflectivity.

3. A method according to claim 1, wherein the degassing barrier layer is designed such that it does not increase reflectivity for UV light with wavelengths of 157 nm, 193 nm, 248 nm, and 365 nm.

4. A method according to claim 1, further comprising configuring the guidance space as a guidance space of a lithography exposure system.

5. A method for reducing the contamination of at least one optical component, that is contained inside a beam guidance space and that is held by a frame defining the beam guidance space, comprising:

coating surfaces of the frame neighboring the beam guidance space at least partially with a degassing barrier layer, wherein the degassing barrier layer is a chemically deposited nickel layer, or silver, gold, or tantalum layer.

6. A method according to claim 5, wherein the degassing barrier layer is a chemically deposited nickel layer in form of a NiP alloy layer applied in a chemical depositing process in an electrolyte that contains sodium hypophosphite as a reducing agent.

7. A method according to claim 5, further comprising configuring the guidance space as a guidance space of a lithography exposure system.

8. An optical beam guidance system for UV light, comprising:

a frame defining a beam guidance space and containing at least one optical component inside the beam guidance space, and a degassing barrier layer that at least partially coats a stainless steel surface of the frame neighboring the beam guidance space.

9. An optical beam guidance system according to claim 8, wherein the degassing barrier layer does not increase reflectivity.

10. An optical beam guidance system according to claim 8, wherein the degassing barrier layer does not increase reflectivity for UV light with wavelengths of 157 nm, 193 nm, 248 nm, and 365 nm.

11. An optical beam guidance system according to claim 8, wherein the optical beam guidance system is configured as a lithography exposure system.

12. An optical beam guidance system for UV light, comprising:

a frame defining a beam guidance space and containing at least one optical component inside the beam guidance space, and a degassing barrier layer that at least partially coats a surface of the frame neighboring the beam guidance space, wherein the degassing barrier layer is silver, gold, or tantalum layer.

13. An optical beam guidance system according to claim 12, wherein the optical beam guidance system is configured as a lithography exposure system.

* * * * *